(12) United States Patent
Xie

(10) Patent No.: US 11,164,916 B1
(45) Date of Patent: Nov. 2, 2021

(54) DISPLAY PANEL, MANUFACTURING METHOD THEREOF, AND DISPLAY DEVICE

(71) Applicant: Wuhan China Star Optoelectronics Semiconductor Display Technology Co., LTD., Hubei (CN)

(72) Inventor: Ming Xie, Wuhan (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 216 days.

(21) Appl. No.: 16/622,003

(22) PCT Filed: May 15, 2019

(86) PCT No.: PCT/CN2019/086992
§ 371 (c)(1),
(2) Date: Dec. 12, 2019

(87) PCT Pub. No.: WO2020/191893
PCT Pub. Date: Oct. 1, 2020

(30) Foreign Application Priority Data

Mar. 27, 2019 (CN) .......................... 201910235643.7

(51) Int. Cl.
*H01L 27/32* (2006.01)
*G06F 3/041* (2006.01)
(Continued)

(52) U.S. Cl.
CPC .......... *H01L 27/323* (2013.01); *G06F 3/0412* (2013.01); *G06F 3/0446* (2019.05); *H01L 51/5256* (2013.01); *G06F 2203/04103* (2013.01); *G06F 2203/04111* (2013.01); *H01L 51/5056* (2013.01); *H01L 2251/558* (2013.01)

(58) Field of Classification Search
CPC ........ G06F 3/0446; G06F 3/041; G06F 3/047; G06F 2203/04111
See application file for complete search history.

(56) References Cited

U.S. PATENT DOCUMENTS

| 2016/0147342 | A1 | 5/2016 | Xiong et al. | |
| 2020/0089356 | A1* | 3/2020 | Qi | .......... H01L 27/323 |
| 2021/0034196 | A1* | 2/2021 | Yun | .......... H01L 27/323 |

FOREIGN PATENT DOCUMENTS

| CN | 104465703 A | 3/2015 |
| CN | 109004004 A | 12/2018 |
| KR | 20150029903 A | 3/2015 |

* cited by examiner

*Primary Examiner* — Alia Sabur
(74) *Attorney, Agent, or Firm* — Benesch, Friedlander, Coplan & Aronoff LLP

(57) ABSTRACT

A display panel includes a first inorganic layer, a touch line layer, a second inorganic layer, an organic layer, and a bridge line which are sequentially stacked. The touch line layer includes a first touch line and a second touch line, and the second touch line is disconnected at an intersection with the first touch line. The second inorganic layer is provided with a first via hole, and the organic layer is provided with a second via hole. The bridge line is electrically connected to the disconnection via the second via hole and the first via hole to implement that the second touch line is in electrical connection at the intersection.

20 Claims, 4 Drawing Sheets

(51) Int. Cl.
*H01L 51/52* (2006.01)
*G06F 3/044* (2006.01)
*H01L 51/50* (2006.01)

DISPLAY PANEL, MANUFACTURING METHOD THEREOF, AND DISPLAY DEVICE

FIELD OF INVENTION

The present disclosure relates to the field of display panel technologies, and more particularly to a display panel, a manufacturing method thereof, and a display device.

BACKGROUND OF INVENTION

In recent years, Active-matrix organic light emitting diode (AMOLED) flexible display technologies have attracted great attention. Flexible display technologies can change shapes of display devices, increase flexibility and diversity of display, and are widely used in the fields of full screens, bendable screens, foldable screens, etc.

However, after a bendable or foldable flexible panel is subjected to multiple consecutive bending, because a total thickness of a touch layer and an encapsulation layer disposed on an OLED device is large, in the touch layer and the encapsulation layer, film breakage is apt to occur, resulting in failure of the flexible panel.

SUMMARY OF INVENTION

An object of the present application is to provide a display panel, a manufacturing method thereof, and a display device, which can reduce a total thickness of a touch layer and an encapsulation layer, improve a bending performance of the display panel, and further prevent the touch layer and the encapsulation layer from being easily broken, thereby resulting in failure of a flexible panel.

In order to solve the above issues, an embodiment of the present application provides a display panel. The display panel includes a first inorganic layer; a touch line layer disposed on the first inorganic layer, wherein the touch line layer comprises a first touch line and a second touch line that are insulated from each other, the first touch line extends along a first predetermined direction, the second touch line extends along a second predetermined direction, and the second touch line is disconnected at an intersection with the first touch line; a second inorganic layer disposed on the first inorganic layer on which the touch line layer is disposed, wherein the second inorganic layer is provided with a first via hole at a position corresponding to a disconnection of the second touch line; an organic layer disposed on the second inorganic layer, wherein the organic layer is provided with a second via hole at a position corresponding to the first via hole; and a bridge line disposed on the organic layer, wherein the bridge line is electrically connected to the disconnection via the second via hole and the first via hole to implement that the second touch line is in electrical connection at the intersection.

In an embodiment of the present application, the display panel further comprises a third inorganic layer disposed on the organic layer provided with the bridge line.

In an embodiment of the present application, the display panel further comprises a substrate and an organic light emitting layer disposed on the substrate, wherein the first inorganic layer is disposed on the organic light emitting layer.

In an embodiment of the present application, wherein a shape of the touch line layer is a grid shape.

In an embodiment of the present application, wherein a thickness of the touch line layer is less than a thickness of the second inorganic layer, and the thickness of the second inorganic layer is less than a thickness of the first inorganic layer.

In an embodiment of the present application, wherein a ratio of a total thickness of the first inorganic layer, the touch line layer, and the second inorganic layer to a thickness of the organic layer ranges from 0.3 to 0.6.

In order to solve the above issues, an embodiment of the present application provides a method of manufacturing a display panel. The method comprises providing a substrate; forming a first inorganic layer on the substrate; forming a touch line layer on the first inorganic layer, wherein the touch line layer comprises a first touch line and a second touch line that are insulated from each other, the first touch line extends along a first predetermined direction, the second touch line extends along a second predetermined direction, and the second touch line is disconnected at an intersection with the first touch line; forming a second inorganic layer on the first inorganic layer on which the touch line layer is formed; forming an organic layer on the second inorganic layer; forming a first via hole at a position on the second inorganic layer corresponding to a disconnection of the second touch line, and forming a second via hole at a position on the organic layer corresponding to the first via hole; and forming a bridge line on the organic layer, wherein the bridge line is electrically connected to the disconnection via the second via hole and the first via hole to implement that the second touch line is in electrical connection at the intersection.

In an embodiment of the present application, forming the touch line layer on the first inorganic layer further comprises: sputtering a metal layer on the first inorganic layer; and etching the metal layer to obtain a patterned touch line layer, wherein the touch line layer comprises the first touch line and the second touch line that are insulated from each other, the first touch line extends along the first predetermined direction, the second touch line extends along the second predetermined direction, and the second touch line is disconnected at the intersection with the first touch line.

In an embodiment of the present application, forming the bridge line on the organic layer further comprises: filling a conductive material in the first via hole and the second via hole and depositing the bridge line on the organic layer, wherein the bridge line is electrically connected to the disconnection via the second via hole and the first via hole to implement that the second touch line is in electrical connection at the intersection.

In an embodiment of the present application, after forming the bridge line on the organic layer, the method further comprises: forming a third inorganic layer on the organic layer on which the bridge line is formed.

In an embodiment of the present application, a shape of the touch line layer is a grid shape.

In an embodiment of the present application, a thickness of the touch line layer is less than a thickness of the second inorganic layer, and the thickness of the second inorganic layer is less than a thickness of the first inorganic layer.

In an embodiment of the present application, a ratio of a total thickness of the first inorganic layer, the touch line layer, and the second inorganic layer to a thickness of the organic layer ranges from 0.3 to 0.6.

In order to solve the above issues, an embodiment of the present application provides a display device comprising a driving circuit and a display panel. The driving circuit is configured to supply a driving voltage to the display panel. The display panel comprises: a first inorganic layer; a touch line layer disposed on the first inorganic layer, wherein the touch line layer comprises a first touch line and a second touch line that are insulated from each other, the first touch line extends along a first predetermined direction, the second touch line extends along a second predetermined direction, and the second touch line is disconnected at an intersection with the first touch line; a second inorganic layer disposed on the first inorganic layer on which the touch line layer is disposed, wherein the second inorganic layer is provided with a first via hole at a position corresponding to a disconnection of the second touch line; an organic layer disposed on the second inorganic layer, wherein the organic layer is provided with a second via hole at a position corresponding to the first via hole; and a bridge line disposed on the organic layer, wherein the bridge line is electrically connected to the disconnection via the second via hole and the first via hole to implement that the second touch line is in electrical connection at the intersection.

In an embodiment of the present application, the display panel further comprises a third inorganic layer disposed on the organic layer provided with the bridge line.

In an embodiment of the present application, the display panel further comprises a substrate and an organic light emitting layer disposed on the substrate, and the first inorganic layer is disposed on the organic light emitting layer.

In an embodiment of the present application, the display panel further comprises a polarizer and a flexible cover, the polarizer is disposed on the third inorganic layer, and the flexible cover is disposed on the polarizer.

In an embodiment of the present application, a shape of the touch line layer is a grid shape.

In an embodiment of the present application, a thickness of the touch line layer is less than a thickness of the second inorganic layer, and the thickness of the second inorganic layer is less than a thickness of the first inorganic layer.

In an embodiment of the present application, a ratio of a total thickness of the first inorganic layer, the touch line layer, and the second inorganic layer to a thickness of the organic layer ranges from 0.3 to 0.6.

Beneficial effects of the present application are: different from the prior art, the display panel provided by the present application can reduce the total thickness of a touch layer and an encapsulation layer by disposing the touch line layer between the two inorganic layers of a thin film encapsulation structure, improve a bending performance of the display panel, thereby avoiding the issues that the touch layer and the encapsulation layer are prone to cracking of film layers and causing a flexible panel to fail.

DESCRIPTION OF DRAWINGS

In order to more clearly illustrate the technical solutions in the embodiments of the present application, the drawings used in the description of the embodiments will be briefly described below. It is obvious that the drawings in the following description are only some embodiments of the present application. Other drawings can also be obtained from those skilled in the art based on these drawings without paying any creative effort.

DETAILED DESCRIPTION OF PREFERRED EMBODIMENTS

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

At present, after a bendable or foldable flexible panel is subjected to multiple consecutive bending, because a total thickness of a touch layer and an encapsulation layer disposed on an OLED device is large, in the touch layer and the encapsulation layer, film breakage is apt to occur, resulting in failure of the flexible panel. In order to solve the above technical problem, the technical solution adopted by the present application is to provide a display panel to reduce a total thickness of a touch layer and an encapsulation layer, improve a bending performance of the display panel, and further prevent the touch layer and the encapsulation layer from being easily broken, thereby resulting in failure of a flexible panel.

Figure 1:
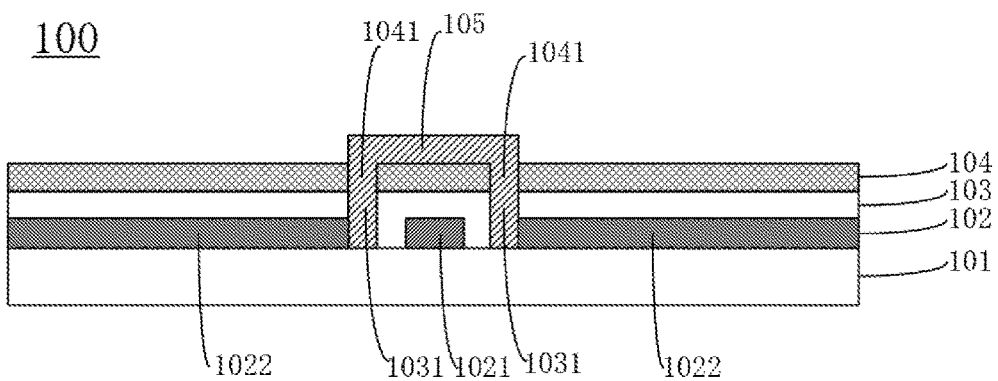
FIG. 1 is a schematic structural diagram of a display panel according to an embodiment of the present application.
Figure 2:
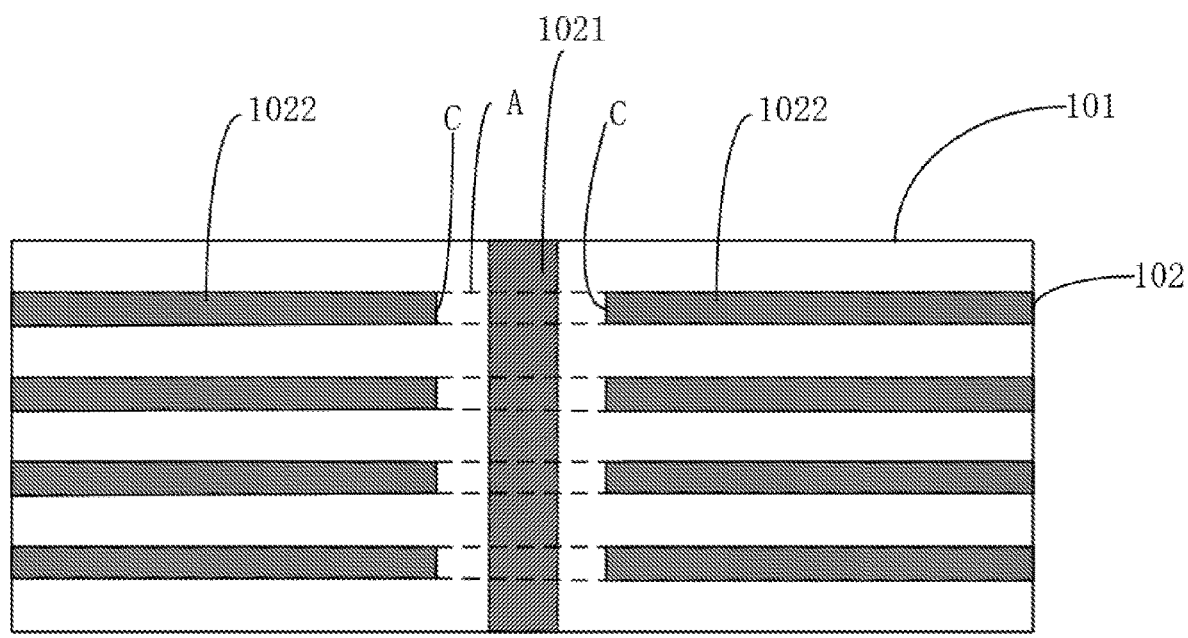
FIG. 2 is a schematic top plan view of a first inorganic layer provided with a touch line layer of FIG. 1.

Referring to FIG. 1 and FIG. 2, FIG. 1 is a schematic structural diagram of a display panel according to an embodiment of the present application, and FIG. 2 is a schematic top plan view of a first inorganic layer provided with a touch line layer of FIG. 1. As shown in FIG. 1 and FIG. 2, a display panel 100 includes a first inorganic layer 101, a touch line layer 102, a second inorganic layer 103, an organic layer 104, and a bridge line 105 which are sequentially stacked.

In an embodiment, the touch line layer 102 is disposed on the first inorganic layer 101. The touch line layer 102 comprises a first touch line 1021 and a second touch line 1022 that are insulated from each other, the first touch line 1021 extends along a first predetermined direction, the second touch line 1022 extends along a second predetermined direction, and the second touch line 1022 is disconnected at an intersection A with the first touch line 1021. The second inorganic layer 103 is disposed on the first inorganic layer 101 on which the touch line layer 102 is disposed. The second inorganic layer 103 is provided with a first via hole 1031 at a position corresponding to a disconnection C of the second touch line 1022. The organic layer 104 is disposed on the second inorganic layer 103. The organic layer 104 is provided with a second via hole 1041 at a position corresponding to the first via hole 1031. The bridge line 105 is disposed on the organic layer 104. The bridge line 105 is electrically connected to the disconnection C via the second via hole 1041 and the first via hole 1031 to implement that the second touch line 1022 is in electrical connection at the intersection A.

Material of the first inorganic layer 101 and material of the second inorganic layer 103 may be one or more of silicon nitride, aluminum nitride, zirconium nitride, titanium nitride, tantalum nitride, titanium oxide, aluminum oxynitride, or silicon oxynitride. Material of the first touch line 1021 and material of the second touch line 1022 may be a metal material having good bending properties such as a titanium alloy or a nano silver wire, or may be a transparent conductive metal oxide such as indium zinc oxide or indium tin oxide. Material of the organic layer 104 may be one of an epoxy resin, an acrolein-based resin, a polyimide resin, polyethylene naphthalate, and polyethylene terephthalate. Material of the bridge wire 105 may be the same as the material of the first touch line 1021 or the second touch line 1022.

Figure 3:
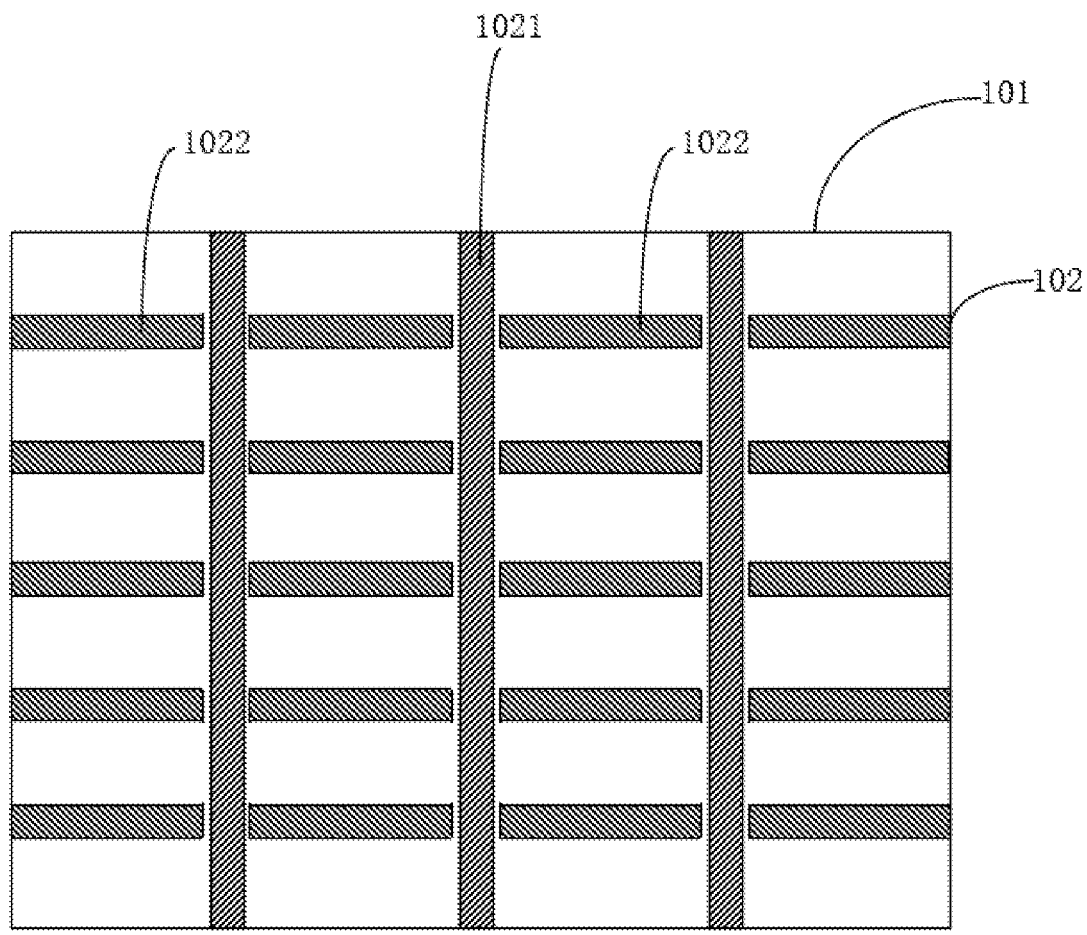
FIG. 3 is another top plan view of the first inorganic layer provided with the touch line layer of FIG. 1.

It should be noted that a broken line frame in FIG. 2 is only used to describe the intersection A of the second touch line 1022 and the first touch line 1021. In one embodiment, as shown in FIG. 3, a shape of the touch line layer 102 may be a grid shape. For example, the first touch line 1021 may extend in a vertical direction, and the second touch line 1022 may extend in a horizontal direction. The intersection of the first touch line 1021 and the second touch line 1022 is connected to be disconnected to insulate the first touch line 1021 and the second touch line 1022 from each other.

In this embodiment, it is considered that the material of the touch line layer 102 is generally a metal or a metal oxide, which reacts with organic substances in the organic encapsulation layer. After the organic encapsulation layer absorbs water and oxygen, the organic encapsulation layer damages the structure of the touch line layer 102 more obviously, and the touch line layer 102 is disposed between the two inorganic layers. Since the inorganic layer has high water and oxygen barrier capability and chemical stability, the touch line layer 102 is disposed between the two inorganic layers of the thin film encapsulation layer to ensure a touch performance of the display panel. Moreover, the touch line layer 102 is disposed between the two inorganic layers of the thin film encapsulation layer, which can reduce a thickness of a touch panel and an optical adhesive tape disposed on the thin film encapsulation layer in the prior art, so that the display panel is thinner and more conducive to bending.

In this embodiment, the touch line layer 102 includes a first touch line 1021 and a second touch line 1022, and the first touch line 1021 and the second touch line 1022 are insulated from each other. In actual use, one of the first touch line 1021 and the second touch line 1022 corresponds to a touch driving electrode, and the other corresponds to a touch sensing electrode, and the same layer setting can reduce touch impedance, and further improve touch signal strength.

Specifically, the second touch line 1022 is disconnected at the intersection A of the first touch line 1021, and the electrical connection of the second touch line 1022 at the intersection A is achieved through the bridge line 105 and an interlayer via hole. In some embodiments, the bridge line 105 may be located between the second inorganic layer 103 and the organic layer 104. However, water vapor generated when the organic layer 104 is inkjet printed on the second inorganic layer 103 provided with the bridge line 105 may cause corrosion to the bridge line 105, affecting a touch performance. In other embodiments, the bridge line 105 may be disposed on the second inorganic layer 103 and another inorganic layer may be disposed on the second inorganic layer 103 provided with the bridge line 105 to avoid corrosion of the bridge line 105 in a fabrication process of the organic layer 104, but this will increase a thickness of the inorganic encapsulation layer, affecting an encapsulation performance and package life of the thin film encapsulation layer. Therefore, in this embodiment, in order to balance a touch performance and a packaging performance of the display panel, the bridge line 105 is disposed on the organic layer 104, and the bridge line 105 is connected to the disconnection C of the second touch line 1022 via the second via hole 1041 on the organic layer 104 and the first via hole 1031 on the second inorganic layer 103.

It is to be noted that fabricating processes of the first via hole 1031 and the second via hole 1041 are subsequent to a process of fabricating the organic layer 103. Specifically, after inkjet printing is performed on the second inorganic layer 103 to form the organic layer 104, after the organic layer 104 is completely dried, the organic layer 104 and the second inorganic layer 103 are punctured to prevent water vapor generated by the organic layer 104 of inkjet printing is prevented from corroding the touch line layer 102, thereby ensuring a touch performance of the display panel.

In one embodiment, a thickness of the touch line layer 102 is less than a thickness of the second inorganic layer 103, and a thickness of the second inorganic layer 103 is less than the thickness of the first inorganic layer 101. For example, the thickness of the touch line layer 102 may ranges from 0.5. to 0.7 μm, the thickness of the first inorganic layer 101 may ranges from 2 to 4 μm, and the thickness of the second inorganic layer 103 may ranges from 0.5 to 1.5 μm, so as to avoid inclusion of the touch circuit layer in the thin film package structure, which may affect packaging of the thin film package structure.

Further, in order to balance water oxygen barrier capability and bending property of the thin film encapsulation structure, a ratio of a total thickness of the first inorganic layer 101, the touch wiring layer 102, and the second inorganic layer 103 to a thickness of the organic layer 104 may be controlled to range from 0.3 to 0.6. For example, the thickness of the first inorganic layer 101 may be 3 μm, the thickness of the touch wiring layer 102 may be 0.7 μm, the thickness of the second inorganic layer 103 may be 1 μm, and the thickness of the organic layer 104 may be 10 μm.

Figure 4:
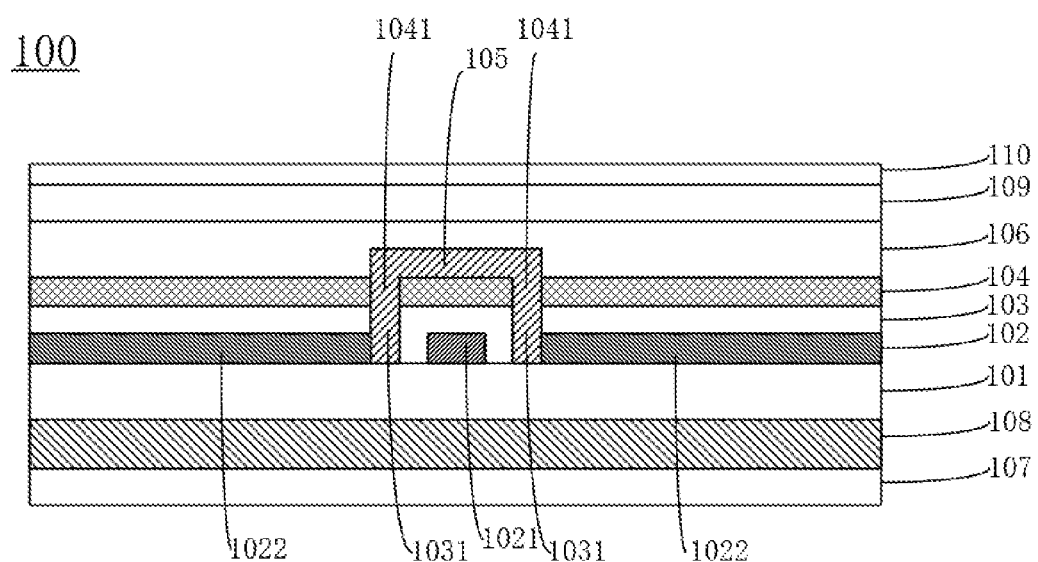
FIG. 4 is another schematic structural diagram of a display panel according to an embodiment of the present application.

In a specific embodiment, as shown in FIG. 4, the display panel 100 further includes a third inorganic layer 106 on the organic layer 104 provided with the bridge line 105 to protect the bridge line 105 from water and oxygen erosion, thereby ensuring the touch performance of the display panel.

Specifically, referring to FIG. 4, the display panel 100 may further include a substrate 107 and an organic light emitting layer 108 disposed on the substrate 107. The first inorganic layer 101 is disposed on the organic light emitting layer 108. The first inorganic layer 101, the second inorganic layer 103, the organic layer 104, and the third inorganic layer 105 on an organic light emitting layer 108 together constitute a thin film encapsulation structure to protect the organic light emitting layer 108 from water and oxygen erosion, thereby improving stability of the display panel and extending the life of the display panel.

In some embodiments, between the organic light emitting layer 108 and the first inorganic layer 11 or on the third inorganic layer 106, a multi-layer structure in which an inorganic encapsulation layer and an organic encapsulation layer are alternately disposed may be further added to more effectively block water and oxygen invade the organic light emitting layer 108. Moreover, in a specific implementation, the encapsulation layer closest to the organic light emitting layer 108 and the farthest encapsulation layer are inorganic encapsulation layers.

With continued reference to FIG. 4, the display panel 100 can further include a polarizer 109 and a flexible cover 110. The polarizer 109 is located on the third inorganic layer 106, and the flexible cover 110 is located on the polarizer 109.

Different from the prior art, the display panel provided by the present embodiment can reduce the total thickness of the touch layer and the encapsulation layer by disposing the touch line layer between the two inorganic layers of a thin film encapsulation structure, improve a bending performance of the display panel, thereby avoiding the issues that the touch layer and the encapsulation layer are prone to cracking of film layers and causing a flexible panel to fail.

Figure 5:
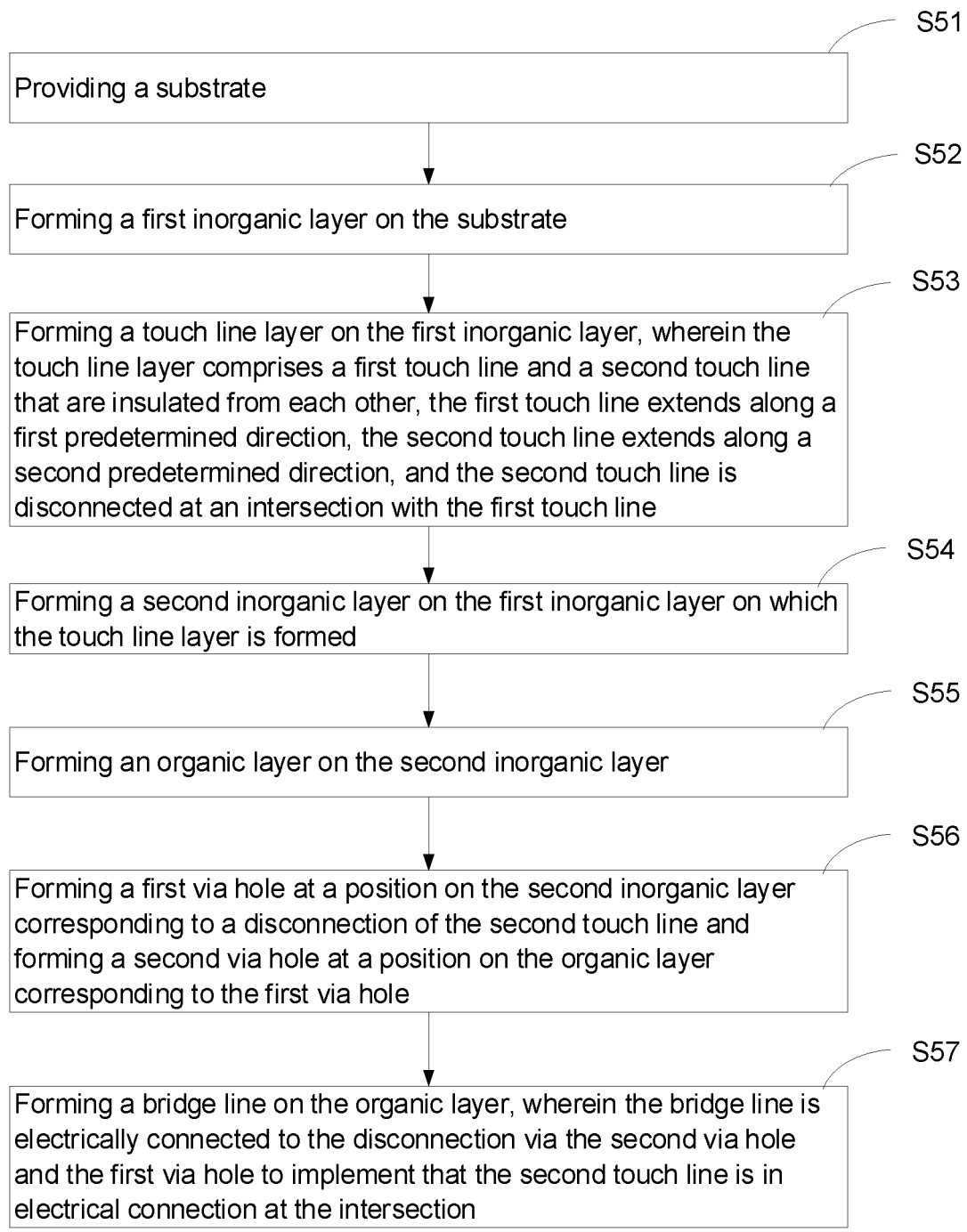
FIG. 5 is a schematic flowchart of a method of manufacturing a display panel according to an embodiment of the present application.

Referring to FIG. 5, FIG. 5 is a schematic flowchart of a method of manufacturing a display panel according to an embodiment of the present application. The method of manufacturing the display panel comprises following steps.

Step S51: providing a substrate.

The substrate is a flexible TFT substrate with a base layer, and the base layer may be made of one of organic polymers such as polyimide, polycarbonate, polyethylene terephthalate, and polyethersulfone substrate.

Step S52: forming a first inorganic layer on the substrate.

Material of the first inorganic layer may be one or more of silicon nitride, aluminum nitride, zirconium nitride, titanium nitride, tantalum nitride, titanium oxide, aluminum oxynitride, or silicon oxynitride.

For example, a silicon nitride layer is deposited on the substrate by an atomic layer deposition or chemical vapor deposition process, and the thickness of the silicon nitride layer may be 3 μm.

Step S53: forming a touch line layer on the first inorganic layer, wherein the touch line layer comprises a first touch line and a second touch line that are insulated from each other, the first touch line extends along a first predetermined direction, the second touch line extends along a second predetermined direction, and the second touch line is disconnected at an intersection with the first touch line.

Specifically, S53 may include the following sub-steps.

Sub-step A: sputtering a metal layer on the first inorganic layer.

Material of the metal layer may be a metal material having good bending properties such as a titanium alloy or a nano silver wire, or may be a transparent conductive metal oxide such as indium zinc oxide or indium tin oxide.

For example, a Ti/Al/Ti metal layer is sputtered on the first inorganic layer by a physical vapor deposition process. The thickness of the Ti/Al/Ti metal layer corresponds to 0.05 μm/0.6 μm/0.05 μm, that is, the thickness of the metal layer is 0.7 μm.

Sub-step B: etching the metal layer to obtain a patterned touch line layer, wherein the touch line layer comprises the first touch line and the second touch line that are insulated from each other, the first touch line extends along the first predetermined direction, the second touch line extends along the second predetermined direction, and the second touch line is disconnected at the intersection with the first touch line.

In one embodiment, a shape of the touch line layer may be a grid shape. For example, the first touch line may extend in a vertical direction, and the second touch line may extend in a horizontal direction. The intersection of the first touch line and the second touch line is connected to be disconnected to insulate the first touch line and the second touch line from each other.

Step S54: forming a second inorganic layer on the first inorganic layer on which the touch line layer is formed.

Material of the second inorganic layer may be one or more of silicon nitride, aluminum nitride, zirconium nitride, titanium nitride, tantalum nitride, titanium oxide, aluminum oxynitride, or silicon oxynitride.

For example, a silicon nitride layer is deposited on the first inorganic layer by an atomic layer deposition or chemical vapor deposition process, and the thickness of the silicon nitride layer may be 1 μm.

In this embodiment, it is considered that the material of the touch line layer is generally a metal or a metal oxide, which reacts with organic substances in the organic encapsulation layer. After the organic encapsulation layer absorbs water and oxygen, the organic encapsulation layer damages the structure of the touch line layer more obviously, and the touch line layer is disposed between the two inorganic layers. Since the inorganic layer has high water and oxygen barrier capability and chemical stability, the touch line layer is disposed between the two inorganic layers of the thin film encapsulation layer to ensure a touch performance of the display panel. Moreover, the touch line layer is disposed between the two inorganic layers of the thin film encapsulation layer, which can reduce a thickness of a touch panel and an optical adhesive tape disposed on the thin film encapsulation layer in the prior art, so that the display panel is thinner and more conducive to bending.

In this embodiment, the touch line layer includes a first touch line and a second touch line, and the first touch line and the second touch line are insulated from each other. In actual use, one of the first touch line and the second touch line corresponds to a touch driving electrode, and the other corresponds to a touch sensing electrode, and the same layer setting can reduce touch impedance, and further improve touch signal strength.

Step S55: forming an organic layer on the second inorganic layer.

Material of the organic layer may be one of an epoxy resin, an acrolein-based resin, a polyimide resin, polyethylene naphthalate, and polyethylene terephthalate.

For example, a polymethyl methacrylate film layer is formed on the second inorganic layer by inkjet printing, and the polymethyl methacrylate film layer may have a thickness of 10 μm.

In one embodiment, a thickness of the touch line layer is less than a thickness of the second inorganic layer, and a thickness of the second inorganic layer is less than the thickness of the first inorganic layer. For example, the thickness of the touch line layer may ranges from 0.5. to 0.7 μm, the thickness of the first inorganic layer may ranges from 2 to 4 μm, and the thickness of the second inorganic layer may ranges from 0.5 to 1.5 μm, so as to avoid inclusion of the touch circuit layer in the thin film package structure, which may affect packaging of the thin film package structure.

Further, in order to balance water oxygen barrier capability and bending property of the thin film encapsulation structure, a ratio of a total thickness of the first inorganic layer, the touch wiring layer, and the second inorganic layer to a thickness of the organic layer may be controlled to range from 0.3 to 0.6.

Step S56: forming a first via hole at a position on the second inorganic layer corresponding to a disconnection of the second touch line and forming a second via hole at a position on the organic layer corresponding to the first via hole.

Specifically, after the organic layer is completely dried, the step S56 is performed to prevent the water vapor generated by the organic layer of inkjet printing from corroding the touch line layer, thereby ensuring the touch performance of the display panel.

For example, after the organic layer is completely dried, the first via hole may be formed on the second inorganic layer at a position corresponding to the disconnection of the second touch line by laser etching, and the second via hole is formed on the organic layer at a position corresponding to the first via hole. In one embodiment, after forming the first via hole, an edge width of the second touch line exposed may be 5 μm.

Step S57: forming a bridge line on the organic layer, wherein the bridge line is electrically connected to the disconnection via the second via hole and the first via hole to implement that the second touch line is in electrical connection at the intersection.

For example, the Step S57 further comprises: filling a conductive material in the first via hole and the second via hole and depositing the bridge line on the organic layer, wherein the bridge line is electrically connected to the disconnection via the second via hole and the first via hole to implement that the second touch line is in electrical connection at the intersection. The conductive material may be a material having low resistivity such as indium tin oxide, aluminum, copper, or silver. The material of the bridge wire may be a metal material having good bending properties such as a titanium alloy or a nano silver wire, or may be a transparent conductive metal oxide such as an indium zinc oxide and indium tin oxide.

In a specific embodiment, after the step S57, the method may further include:

Forming a third inorganic layer on the organic layer on which the bridge line is formed.

Material of the third inorganic layer may be one or more of silicon nitride, aluminum nitride, zirconium nitride, titanium nitride, tantalum nitride, titanium oxide, aluminum oxynitride, and silicon oxynitride.

For example, a silicon nitride layer may be deposited on the organic layer on which the bridge line is formed by an atomic layer deposition or chemical vapor deposition process, and the thickness of the silicon nitride layer may be 1 μm.

Specifically, the third inorganic layer covers the bridge line, which can protect the bridge line from being eroded by water and oxygen, thereby ensuring the touch performance of the display panel. And the third inorganic layer, the first inorganic layer, the second inorganic layer, and the organic layer together constitute a thin film encapsulation structure of the display panel to protect the organic light emitting material in the display panel from water and oxygen, thereby improving stability of the display panel and extending the life of the display panel.

Different from the prior art, the manufacturing of the display panel provided by the present embodiment can reduce the total thickness of the touch layer and the encapsulation layer by disposing the touch line layer between the two inorganic layers of a thin film encapsulation structure, improve a bending performance of the display panel, thereby avoiding the issues that the touch layer and the encapsulation layer are prone to cracking of film layers and causing a flexible panel to fail.

Figure 6:
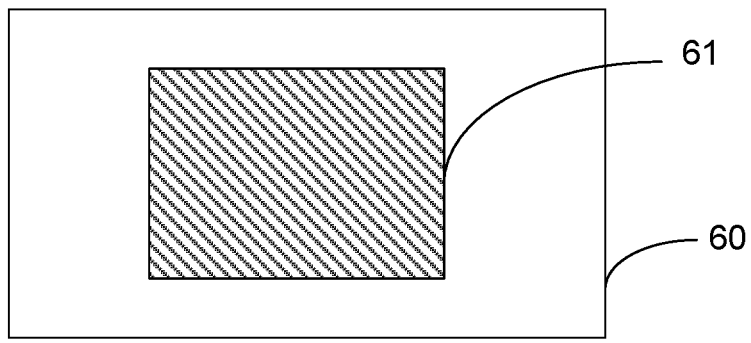
FIG. 6 is a schematic structural diagram of a display device according to an embodiment of the present application.

Referring to FIG. 6, an embodiment of the present application further provides a display device including a driving circuit and any one of the above display panels 61. The driving circuit is configured to supply a driving voltage to the display panel 61.

The display panel 61 includes a first inorganic layer, a touch wiring layer, a second inorganic layer, an organic layer, and a bridge line which are sequentially stacked. The touch line layer is disposed on the first inorganic layer. The touch line layer comprises a first touch line and a second touch line that are insulated from each other, the first touch line extends along a first predetermined direction, the second touch line extends along a second predetermined direction, and the second touch line is disconnected at an intersection with the first touch line. The second inorganic layer is disposed on the first inorganic layer on which the touch line layer is disposed. The second inorganic layer is provided with a first via hole at a position corresponding to a disconnection of the second touch line. The organic layer is disposed on the second inorganic layer, the organic layer is provided with a second via hole at a position corresponding to the first via hole. The bridge line disposed on the organic layer, the bridge line is electrically connected to the disconnection via the second via hole and the first via hole to implement that the second touch line is in electrical connection at the intersection.

Different from the prior art, the display device provided by the present embodiment can reduce the total thickness of the touch layer and the encapsulation layer by disposing the touch line layer between the two inorganic layers of a thin film encapsulation structure, improve a bending performance of the display panel, thereby avoiding the issues that the touch layer and the encapsulation layer are prone to cracking of film layers and causing a flexible panel to fail.

The above is only the preferred embodiment of the present application and is not intended to limit the application. Any modifications, equivalent substitutions, and improvements made within the spirit and principles of the present application are intended to be included within the scope of the present application.

What is claimed is:

1. A display panel, comprising:
    a first inorganic layer;
    a touch line layer disposed on the first inorganic layer, wherein the touch line layer comprises a first touch line and a second touch line that are insulated from each other, the first touch line extends along a first predetermined direction, the second touch line extends along a second predetermined direction, and the second touch line is disconnected at an intersection with the first touch line;
    a second inorganic layer disposed on the first inorganic layer on which the touch line layer is disposed, wherein the second inorganic layer is provided with a first via hole at a position corresponding to a disconnection of the second touch line;
    an organic layer disposed on the second inorganic layer, wherein the organic layer is provided with a second via hole at a position corresponding to the first via hole; and
    a bridge line disposed on the organic layer, wherein the bridge line is electrically connected to the disconnection via the second via hole and the first via hole to implement that the second touch line is in electrical connection at the intersection.

2. The display panel according to claim 1, further comprising a third inorganic layer disposed on the organic layer provided with the bridge line.

3. The display panel according to claim 2, further comprising a substrate and an organic light emitting layer disposed on the substrate, wherein the first inorganic layer is disposed on the organic light emitting layer.

4. The display panel according to claim 1, wherein a shape of the touch line layer is a grid shape.

5. The display panel according to claim 1, wherein a thickness of the touch line layer is less than a thickness of the second inorganic layer, and the thickness of the second inorganic layer is less than a thickness of the first inorganic layer.

6. The display panel according to claim 1, wherein a ratio of a total thickness of the first inorganic layer, the touch line layer, and the second inorganic layer to a thickness of the organic layer ranges from 0.3 to 0.6.

7. A method of manufacturing a display panel, comprising:
   providing a substrate;
   forming a first inorganic layer on the substrate;
   forming a touch line layer on the first inorganic layer, wherein the touch line layer comprises a first touch line and a second touch line that are insulated from each other, the first touch line extends along a first predetermined direction, the second touch line extends along a second predetermined direction, and the second touch line is disconnected at an intersection with the first touch line;
   forming a second inorganic layer on the first inorganic layer on which the touch line layer is formed;
   forming an organic layer on the second inorganic layer;
   forming a first via hole at a position on the second inorganic layer corresponding to a disconnection of the second touch line, and forming a second via hole at a position on the organic layer corresponding to the first via hole;
   forming a bridge line on the organic layer, wherein the bridge line is electrically connected to the disconnection via the second via hole and the first via hole to implement that the second touch line is in electrical connection at the intersection.

8. The method of manufacturing the display panel according to claim 7, wherein forming the touch line layer on the first inorganic layer further comprises:
   sputtering a metal layer on the first inorganic layer; and
   etching the metal layer to obtain a patterned touch line layer, wherein the touch line layer comprises the first touch line and the second touch line that are insulated from each other, the first touch line extends along the first predetermined direction, the second touch line extends along the second predetermined direction, and the second touch line is disconnected at the intersection with the first touch line.

9. The method of manufacturing the display panel according to claim 7, wherein forming the bridge line on the organic layer further comprises:
   filling a conductive material in the first via hole and the second via hole and depositing the bridge line on the organic layer, wherein the bridge line is electrically connected to the disconnection via the second via hole and the first via hole to implement that the second touch line is in electrical connection at the intersection.

10. The method of manufacturing the display panel according to claim 7, wherein after forming the bridge line on the organic layer, the method further comprises:
    forming a third inorganic layer on the organic layer on which the bridge line is formed.

11. The method of manufacturing the display panel according to claim 7, wherein a shape of the touch line layer is a grid shape.

12. The method of fabricating the display panel according to claim 7, wherein a thickness of the touch line layer is less than a thickness of the second inorganic layer, and the thickness of the second inorganic layer is less than a thickness of the first inorganic layer.

13. The method of manufacturing the display panel according to claim 7, wherein a ratio of a total thickness of the first inorganic layer, the touch line layer, and the second inorganic layer to a thickness of the organic layer ranges from 0.3 to 0.6.

14. A display device comprising a driving circuit and a display panel, wherein the driving circuit is configured to supply a driving voltage to the display panel,
    wherein the display panel comprises:
    a first inorganic layer;
    a touch line layer disposed on the first inorganic layer, wherein the touch line layer comprises a first touch line and a second touch line that are insulated from each other, the first touch line extends along a first predetermined direction, the second touch line extends along a second predetermined direction, and the second touch line is disconnected at an intersection with the first touch line;
    a second inorganic layer disposed on the first inorganic layer on which the touch line layer is disposed, wherein the second inorganic layer is provided with a first via hole at a position corresponding to a disconnection of the second touch line;
    an organic layer disposed on the second inorganic layer, wherein the organic layer is provided with a second via hole at a position corresponding to the first via hole; and
    a bridge line disposed on the organic layer, wherein the bridge line is electrically connected to the disconnection via the second via hole and the first via hole to implement that the second touch line is in electrical connection at the intersection.

15. The display device according to claim 14, wherein the display panel further comprises a third inorganic layer disposed on the organic layer provided with the bridge line.

16. The display device according to claim 15, wherein the display panel further comprises a substrate and an organic light emitting layer disposed on the substrate, and the first inorganic layer is disposed on the organic light emitting layer.

17. The display device according to claim 15, wherein the display panel further comprises a polarizer and a flexible cover, the polarizer is disposed on the third inorganic layer, and the flexible cover is disposed on the polarizer.

18. The display device according to claim 14, wherein a shape of the touch line layer is a grid shape.

19. The display device according to claim 14, wherein a thickness of the touch line layer is less than a thickness of the second inorganic layer, and the thickness of the second inorganic layer is less than a thickness of the first inorganic layer.

20. The display device according to claim 14, wherein a ratio of a total thickness of the first inorganic layer, the touch line layer, and the second inorganic layer to a thickness of the organic layer ranges from 0.3 to 0.6.

* * * * *